United States Patent
Wei

(10) Patent No.: US 9,799,391 B1
(45) Date of Patent: Oct. 24, 2017

(54) DRAM CIRCUIT, REDUNDANT REFRESH CIRCUIT AND REFRESH METHOD

(71) Applicant: NANYA TECHNOLOGY CORPORATION, Taoyuan (TW)

(72) Inventor: Tzu Yin Wei, Hsinchu (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 15/357,420

(22) Filed: Nov. 21, 2016

(51) Int. Cl.
| | | |
|---|---|---|
| G11C 11/406 | (2006.01) | |
| G11C 11/408 | (2006.01) | |
| G11C 29/00 | (2006.01) | |
| G06F 3/06 | (2006.01) | |

(52) U.S. Cl.
CPC ...... *G11C 11/40618* (2013.01); *G06F 3/0619* (2013.01); *G06F 3/0659* (2013.01); *G06F 3/0683* (2013.01); *G11C 11/4087* (2013.01); *G11C 29/783* (2013.01)

(58) Field of Classification Search
CPC .................................................. G11C 11/406
USPC ......................................................... 365/222
See application file for complete search history.

(56) References Cited

U.S. PATENT DOCUMENTS

| | | | |
|---|---|---|---|
| 9,053,815 B2 | 6/2015 | Bell et al. | |
| 9,190,139 B2 * | 11/2015 | Jung | G11C 8/08 |
| 9,208,850 B2 * | 12/2015 | Hwang | G11C 11/406 |
| 9,361,953 B2 * | 6/2016 | Chi | G11C 7/02 |
| 9,472,258 B2 * | 10/2016 | Shin | G11C 11/40611 |
| 9,478,316 B1 * | 10/2016 | Ryu | G11C 29/785 |
| 9,514,850 B2 * | 12/2016 | Kim | G11C 29/83 |
| 2016/0019944 A1 * | 1/2016 | Jung | G11C 29/76 365/200 |
| 2016/0351248 A1 * | 12/2016 | Jung | G11C 11/40618 |

* cited by examiner

*Primary Examiner* — Son Mai
(74) *Attorney, Agent, or Firm* — Muncy, Geissler, Olds & Lowe, P.C.

(57) ABSTRACT

A DRAM circuit includes an array having a normal word line, a first redundant word line and a second redundant word line immediately adjacent to the first redundant word line. The second redundant word line is activated if the normal word line is assigned, by a memory controller external to the DRAM circuit, to be activated. A redundant refresh circuit is configured to determine that the first redundant word line is required to be refreshed in response to the second redundant word line being activated; and a row decoder is configured to, according to the determination of the redundant refresh circuit, refresh the first redundant word line.

19 Claims, 6 Drawing Sheets

DRAM CIRCUIT, REDUNDANT REFRESH CIRCUIT AND REFRESH METHOD

TECHNICAL FIELD

The present disclosure relates to a DRAM circuit, redundant refresh circuit and refresh method, and more particularly, to row hammer refresh operation of a dynamic random access memory.

DISCUSSION OF THE BACKGROUND

Dynamic random access memory (DRAM) is a type of random access memory that stores each bit of data in a separate capacitor. A simplest DRAM cell comprises a single N-type metal-oxide-semiconductor (NMOS) transistor and a single capacitor. If charges are stored in the capacitor, the cell is said to store a logic HIGH, depending on the convention used. Then if no charge is present, the cell is said to store a logic LOW. Since the charges in the capacitor dissipate over time, DRAM systems require additional refreshing circuitries to periodically refresh the charges stored in the capacitors. Since a capacitor can store only a very limited amount of charges, in order to quickly distinguish the difference between a logic '1' and a logic '0', two bit-lines (BLs) are typically used for each bit, wherein the first in the bit line pair is known as a bit line true (BLT) and the other is the bit line complement (BLC). The single NMOS transistor's gate is controlled by a word line (WL).

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY

One aspect of the present disclosure provides a DRAM circuit comprising an array including a normal word line, a first redundant word line and a second redundant word line immediately adjacent to the first redundant word line, wherein the second redundant word line is activated if the normal word line is assigned, by a memory controller external to the DRAM circuit, to be activated; a redundant refresh circuit configured to determine that the first redundant word line is required to be refreshed in response to the second redundant word line being activated; and a row decoder configured to, according to the determination of the redundant refresh circuit, refresh the first redundant word line.

In some embodiments, the normal word line is a second normal word line, the array further includes a first normal word line immediately adjacent to the second normal word line. The DRAM circuit further comprises a target row counter configured to determine that the first normal word line is required to be refreshed in response to the second normal word line being assigned to be activated, wherein the row decoder ignores the determination from the target row counter, and, according to the determination from the redundant refresh circuit, refresh the first redundant word line.

In some embodiments, the DRAM circuit further comprises a redundancy match circuit configured to determine that the second redundant word line is to be activated in a condition that the redundancy match circuit receives a signal including information on an address of the second normal word line.

In some embodiments, the DRAM circuit further comprises a primary multiplexer configured to receive the signal including the information on the address of the second normal word line and a signal including the determination from the target row counter, and pass to the redundancy match circuit one of the signal including the information and the signal including the determination.

In some embodiments, the redundant refresh circuit retains the determination until the redundant refresh circuit receives a signal including a command indicating to refresh a redundant word line immediately adjacent to a redundant word line to be activated, and the redundant refresh circuit provides the determination to the row decoder after the redundant refresh circuit receives the signal.

In some embodiments, the redundant refresh circuit includes a latch configured to retain the determination indicating that the second redundant word line is to be activated; and a shift circuit configured to determine that the first redundant word line of the array is required to be refreshed according to the determination from the latch.

In some embodiments, the redundant refresh circuit includes a refresh multiplexer configured to retain the determination from the shift circuit until receiving a signal including a command indicating to refresh a redundant word line immediately adjacent to a redundant word line to be activated.

In some embodiments, the refresh multiplexer is configured to provide the determination from the shift circuit to the row decoder after the refresh multiplexer receives the signal including the command indicating to refresh the redundant word line immediately adjacent to the redundant word line to be activated.

In some embodiments, the DRAM circuit further comprises an OR gate configured to receive a first signal with a first logic level and a second signal with a second logic level, and output a third signal with the first logic level. The first logic level of the first signal indicates that the first redundant word line is to be deactivated, the second logic level of the second signal indicates that the second redundant word line is to be activated, and the first logic level of the third signal indicates that one of the first redundant word line and the second redundant word line is to be activated.

In some embodiments, the DRAM circuit further comprises an AND gate configured to receive the third signal and the signal including the command indicating to refresh the redundant word line immediately adjacent to the redundant word line to be activated, and output the signal including the command indicating to refresh the redundant word line immediately adjacent to the redundant word line to be activated.

Another aspect of the present disclosure provides a redundant refresh circuit in a DRAM circuit. The redundant refresh circuit comprises a latch configured to receive a determination indicating that a second redundant word line of an array is to be activated, and retain the determination, wherein the second redundant word line is activated if a normal word line of the array is assigned to be activated by a command external to the DRAM circuit; and a shift circuit configured to determine that a first redundant word line of the array is required to be refreshed according to the determination from the latch, wherein the first redundant word line is immediately adjacent to the second redundant word line.

In some embodiments, the redundant refresh circuit includes a refresh multiplexer configured to receive the determination from the shift circuit until receiving a signal including a command indicating to refresh a redundant word line immediately adjacent to a redundant word line to be activated, and provide the determination from the shift circuit to a row decoder external to the redundant refresh circuit after the refresh multiplexer receives the signal.

In some embodiments, a refresh multiplexer is configured to receive the determination, and provide to a row decoder one of the received determination and the determination from the shift circuit.

In some embodiments, the refresh multiplexer is further configured to provide to the row decoder one of the received determination and the determination from the shift circuit based on a signal including a command on whether to refresh a redundant word line immediately adjacent to a redundant word line to be activated.

In some embodiments, the refresh multiplexer provides the determination from the shift circuit to the row decoder if the signal includes the command to refresh the redundant word line immediately adjacent to the redundant word line to be activated.

In some embodiments, the redundant refresh circuit further comprises an OR gate configured to receive a first signal with a first logic level and a second signal with a second logic level, and output a third signal with the first logic level. The first logic level of the first signal indicates that the first redundant word line is to be deactivated, the second logic level of the second signal indicates that the second redundant word line is to be activated, and the first logic level of the third signal indicates that one of the first redundant word line and the second redundant word line is to be activated.

In some embodiments, the redundant refresh circuit further comprises an AND gate configured to receive the third signal and the signal including the command on whether to refresh the redundant word line immediately adjacent to the redundant word line to be activated.

Another aspect of the present disclosure provides a method comprising activating a second redundant word line of an array if a second normal word line of the array is assigned, by a memory controller external to the DRAM circuit, to be activated; determining that a first redundant word line of the array is required to be refreshed in response to the second redundant word line being activated, wherein the first redundant word line is immediately adjacent to the second redundant word line; determining that a first normal word line of the array is required to be refreshed in response to the second normal word line being assigned to be activated, wherein the first normal word line is immediately adjacent to the second normal word line; and either refreshing the first redundant word line according to the determination that the first redundant word line is required to be refreshed, or refreshing the first normal word line according to the determination that the first normal word line is required to be refreshed.

In some embodiments, refreshing the first redundant word line is performed when receiving a signal including a command indicating to refresh a redundant word line immediately adjacent to an activated redundant word line.

In some embodiments, refreshing the first normal word line is performed when receiving a signal including a command indicating not to refresh a redundant word line immediately adjacent to an activated redundant word line.

With a redundant refresh circuit of the present disclosure, a first redundant word line and a third redundant word line immediately adjacent to an activated second redundant word line can be refreshed. A row hammer issue is accordingly alleviated, or even eliminated. As a result, the first redundant word line can be used to replace a word line to be activated. Also, the third redundant word line can be used to replace another word line to be activated. Usage of a redundant word line is relatively efficient. As a result, an area cost is relatively low.

In contrast, in some existing circuits, such circuits are unable to determine a first redundant word line immediately adjacent to a second redundant word line to be activated. In that case, the first redundant word line cannot be refreshed, and therefore suffers from the row hammer issue, which means that a data stored in a DRAM cell controlled by the first redundant word line may be flipped. In view of this, the first redundant word line is not useable. Usage of redundant word lines of the existing circuits is relatively inefficient. As a result, an area cost is relatively high.

The foregoing has outlined rather broadly the features and technical advantages of the present disclosure in order that the detailed description of the disclosure that follows may be better understood. Additional features and advantages of the disclosure will be described hereinafter, which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
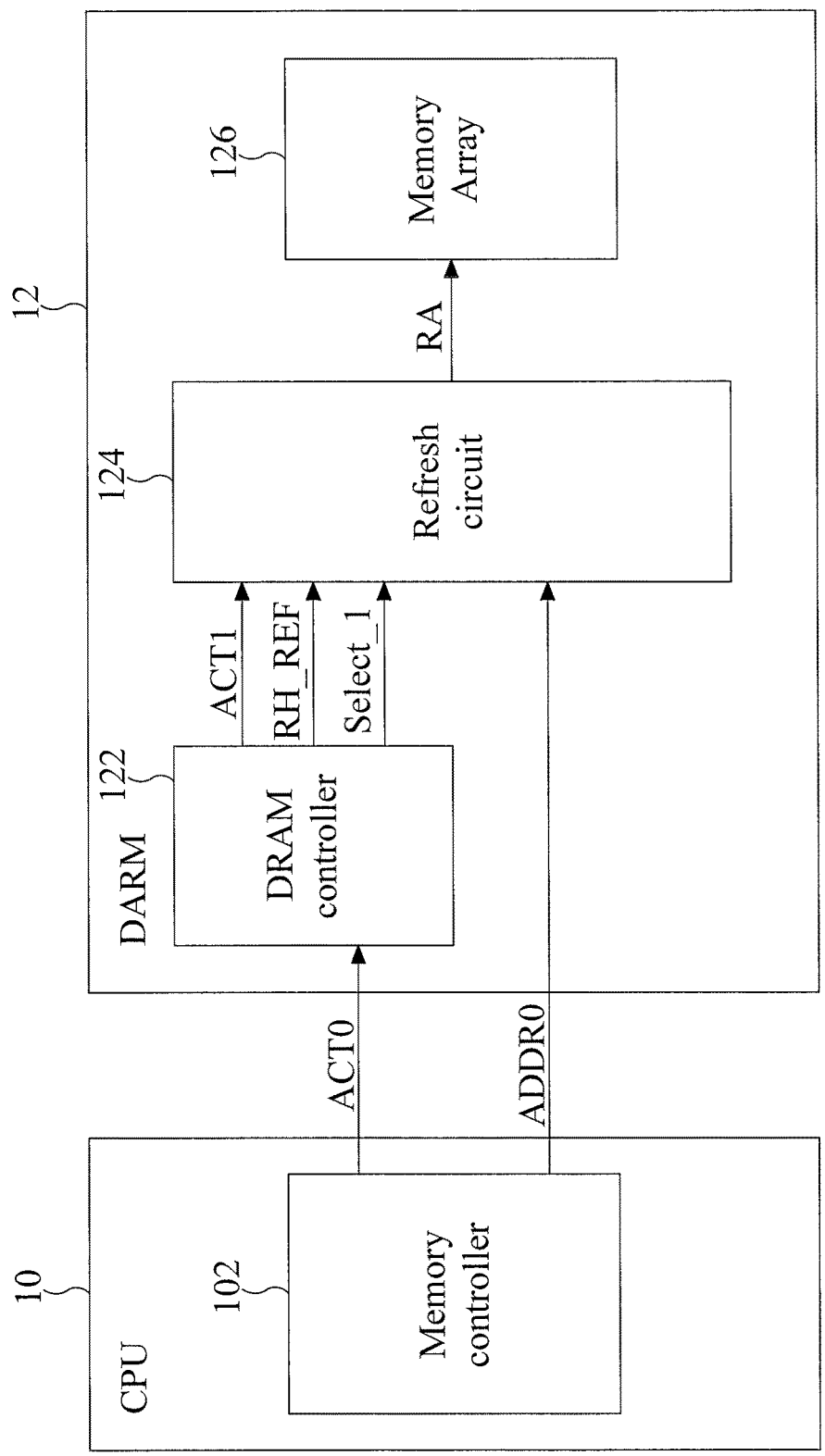
FIG. 1 is a block diagram of a DRAM circuit coupled to a CPU in accordance with some embodiments of the present disclosure.

Embodiments, or examples, of the disclosure illustrated in the drawings are now described using specific language. It will nevertheless be understood that no limitation of the scope of the disclosure is thereby intended. Any alterations and modifications in the described embodiments, and any further applications of principles described in this document are contemplated as would normally occur to one of ordinary skill in the art to which the disclosure relates. Reference numerals may be repeated throughout the embodiments, but this does not necessarily require that feature(s) of one embodiment apply to another embodiment, even if they share the same reference numeral. It will be understood that when an element is referred to as being "connected to" or "coupled with" another element, it may be directly connected to or coupled to the other element, or intervening elements may be present.

In the below description, a signal is asserted with a high logical value to activate a corresponding device when the device is active high. In contrast, the signal is deserted with a low logical value to deactivate the corresponding device. When the device is active low, however, the signal is asserted with a low logical value to activate the device, and is deserted with a high logical value to deactivate the device.

FIG. 1 is a block diagram of a DRAM (dynamic random access memory) circuit 12 coupled to a CPU (central processing unit) 10 in accordance with some embodiments of the present disclosure. Referring to FIG. 1, the DRAM circuit 12 includes a DRAM controller 122, a refresh circuit 124 and a memory array 126.

The DRAM controller 122 is configured to, in response to an active command ACT0 from a memory controller 102 of the CPU 10 external to the DRAM circuit 12, provide an active command ACT1, thereby activating a word line or a redundant word line in the memory array 126.

The refresh circuit 124 receives from the memory controller 102 an address ADDR0 of a normal word line assigned to be activated. The address ADDR0 is accompanied with the active command ACT0 from the memory controller 102 to be provided. The normal word line is assigned by the memory controller 102 external to the DRAM circuit 12 to be activated. Moreover, the refresh circuit 124 is configured to, in response to a row hammer refresh command RH_REF, perform a row hammer refresh, which will be described in detail below. Furthermore, the refresh circuit 124 provides a signal RA, including information on which word line or which redundant word line is requested to be refreshed, in order to refresh the normal word line and the redundant word line.

Figure 2:
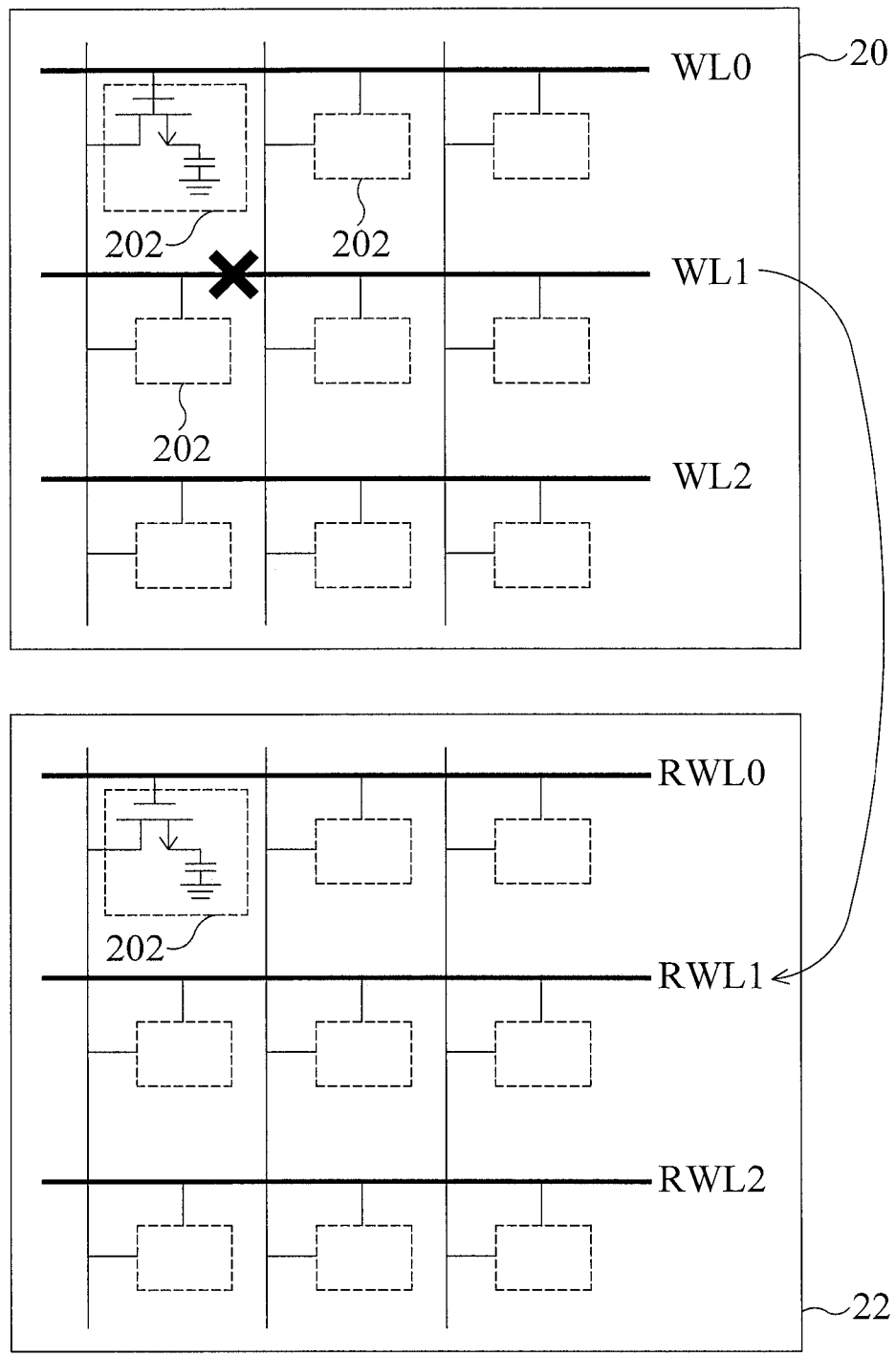
FIG. 2 is a schematic diagram of the memory array shown in FIG. 1 in accordance with some embodiments of the present disclosure.

FIG. 2 is a schematic diagram of the memory array 126 shown in FIG. 1 in accordance with some embodiments of the present disclosure. Referring to FIG. 2, the memory array 126 includes a first bank 20 and a second bank 22. The first bank 20 includes a first normal word line WL0, a second normal word line WL1 and a third word line WL2. Each of the first normal word line WL0, the second normal word line WL1 and the third word line WL2 is used to control a DRAM cell 202 coupled thereto. The second normal word line WL1 is immediately adjacent to the first normal word line WL0. Also, the second normal word line WL1 is immediately adjacent to the third word line WL2.

The term "immediately adjacent to" used in the present disclosure represents that there is no further line between two lines. For example, when the first normal word line WL0 is immediately adjacent to the second normal word line WL1, there is no other normal word lines between the first normal word line WL0 and the second normal word line WL1. Similarly, when the first redundant word line RWL0 is immediately adjacent to the second redundant word line RWL1, there is no other redundant word lines between the first redundant word line RWL0 and the second redundant word line RWL1.

The second bank 22 includes a first redundant word line RWL0, a second redundant word line RWL1 and a third redundant word line RWL2. Each of the first redundant word line RWL0, the second redundant word line RWL1 and a third redundant word line RWL2 is used to control a DRAM cell 202 coupled thereto. The second redundant word line RWL1 is immediately adjacent to the first redundant word line RWL0. Also, the second redundant word line RWL1 is immediately adjacent to the third redundant word line RWL2.

During the semiconductor manufacturing process, a word line may be damaged and therefore is not useable. For addressing such issue, it is designed that a redundant word line is used to replace such damaged word line to be activated. For example, in the present embodiment, the second redundant word line RWL1 is activated if the second normal word line WL1 is assigned, by the memory controller 102 external to the DRAM circuit 122, to be activated. In another example, the second normal word line WL1 can be replaced by the first redundant word line RWL0.

When a word line (either a normal word line or a redundant word line) has been activated more than, for example, 300 k times, a row hammer issue may be incurred. It is assumed that the second normal word line WL1 is not damaged, and is not replaced by the second redundant word line RWL1 to be activated. Since the first normal word line WL0 and the third word line WL2 are immediately adjacent to the second normal word line WL1, if the second normal word line WL1 is activated more than 300 k times, a data stored in the DRAM cell 202 of both the first normal word line WL0 and the third word line WL2 may be flipped without activating the first normal word line WL0 and the third word line WL2. For example, the data is flipped from logic level "high" to logic level "low," and vice versa.

In the present embodiment, the second word line WL1 is damaged, and is replaced by the second redundant word line RWL1 to be activated. Since the first redundant word line RWL0 and the third redundant word line RWL2 are immediately adjacent to the second redundant word line RWL1, if the second redundant word line RWL1 is activated more than 300 k times, a data stored in the DRAM cell 202 controlled by both the first redundant word line RWL0 and the third redundant word line RWL2 may be flipped without activating the first redundant word line RWL0 and the third redundant word line RWL2. In view of this, the refresh circuit 124 of the present disclosure is presented.

Figure 3:
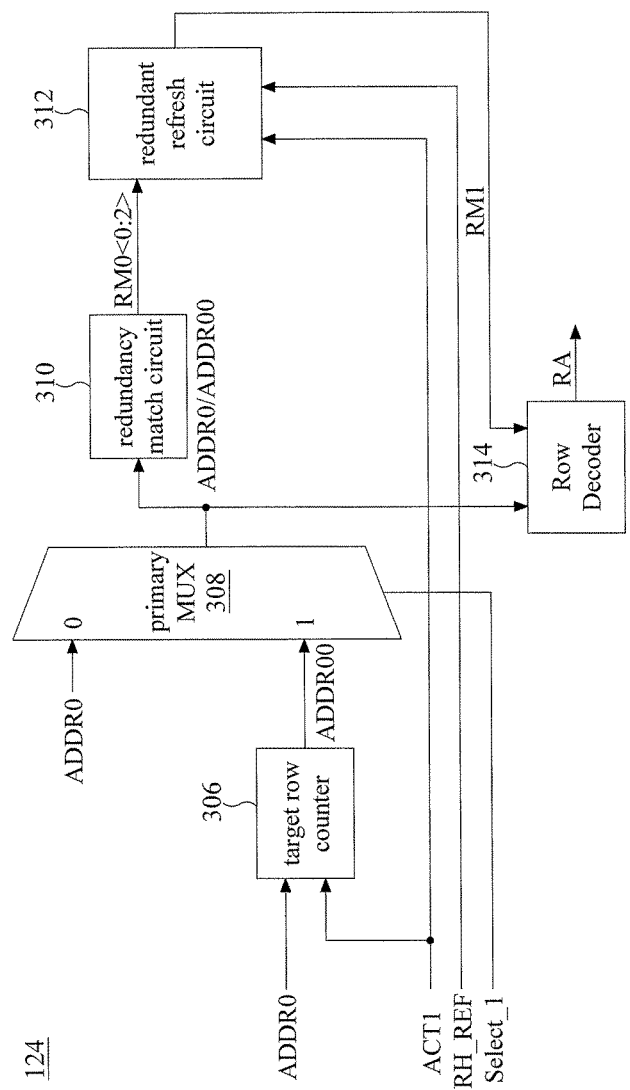
FIG. 3 is a block diagram of the refresh circuit shown in FIG. 1 in accordance with some embodiments of the present disclosure.

FIG. 3 is a block diagram of the refresh circuit 124 shown in FIG. 1 in accordance with some embodiments of the present disclosure. Referring to FIG. 3, the refresh circuit 124 includes a target row counter 306, a primary multiplexer (MUX) 308, a redundancy match circuit 310, a redundant refresh circuit 312 and a row decoder 314.

The target row counter 306 is configured to receive the address ADDR0 of a word line assigned, by the memory controller 102, to be activated, and, in response to the active command ACT1, registers the address ADDR0. In the present embodiment, the second normal word line WL1 is assigned to be activated. Therefore, the address ADDR0 includes an address of the second normal word line WL1. Further, a target row counter 306 is configured to determine that the first normal word line WL0 and the third word line WL2 are required to be refreshed in response to that the second normal word line WL1 is assigned to be activated. For example, it is assumed that an address of the first normal word line WL0 is [00] in binary code. The target row counter 306 according to the address [00] determines an address [01], wherein the address [01] is an address of the second normal word line WL1. Moreover, the target row counter 306 according to the address [00] determines an address [10], wherein the address [10] is an address of the third normal word line WL2.

The primary multiplexer 308 is configured to receive the address ADDR0 of the normal word line assigned to be activated at its terminal "0", and a signal ADDR00 including the determination from the target row counter 306 at its terminal "1." Moreover, the primary multiplexer 308 is configured to, in response to a selection signal Select_1, pass to the redundancy match circuit 310 one of the address ADDR0 and the signal ADDR00 including the determination. Specifically, if the selection signal Select_1 includes information on an active operation being performed, the primary multiplexer 308 outputs the address ADDR0. In the present embodiment, the primary multiplexer 308 outputs the address [01] of the second normal word line WL1. Alternatively, if the selection signal Select_1 includes information on a row hammer refresh operation being performed, the primary multiplexer 308 outputs to the redundancy match circuit 310 the signal ADDR00 including the determination. In the present embodiment, the determination includes one of the addresses [00] and [10].

The redundancy match circuit 310 is configured to store information on a relationship between a damaged normal word line and a redundant word line, determine whether a normal word line assigned to be activated is damaged and therefore is replaced by the redundant word line, and provide the determination RM0<0:2>. In the present embodiment, since there are three redundant word lines, the determination is designated as RM0<0:2>. In another embodiment, when there are four redundant word lines, the determination is designated as RM0<0:3>. In the present embodiment, the damaged normal word line is the second normal word line WL1, and the second redundant word line RWL1 replaces the second normal word line WL1 to be activated. In that case, the redundancy match circuit 310 stores the address [01] of the second normal word line WL1, and the relationship between the second normal word line WL1 and the second redundant word line RWL1.

When the redundancy match circuit 310 receives an address [00] of an undamaged first normal word line WL0, since the redundancy match circuit 310 only stores the address [01], the match fails. Accordingly, the redundancy match circuit 310 provides the determination RM0<0:2> of [000]. When all the numbers in the bracket are zero, the match fails, which means that the undamaged first normal word line WL0 is not replaced by any of the first redundant word line RWL0, the second redundant word line RWL1 and the third redundant word line RWL2 to be activated.

Alternatively, a redundancy match circuit 310 is configured to determine that the second redundant word line RWL1 is used to replace the second normal word line WL1 to be activated in a condition that the redundancy match circuit 310 receives the address [01] of the second normal word line WL1. Specifically, when the redundancy match circuit 310 receives the same address [01] as the redundancy match circuit 310 stores, the match succeeds. The redundancy match circuit 310 provides the determination RM0<0:2> of [010]. The second number "1" in [010] represents that the second redundant word line RWL1 will replace a damaged normal word line to be activated. In the present embodiment, the second number "1" in [010] represents that the second redundant word line RWL1 will replace the second normal word line WL1 to be activated. On the other hand, when the determination RM0<0:2> is [100], the match succeeds, which represents that the first redundant word line RWL0 will replace a damaged normal word line to be activated. Further, when the determination RM0<0:2> is [001], the match succeeds, which represents that the third redundant word line RWL2 will replace a damaged normal word line to be activated.

The redundant refresh circuit 312 is configured to, in response to the active command ACT1, store the determination RM0<0:2>. Moreover, the redundant refresh circuit 312 is configured to, in response to the active command ACT1, determine according to the determination RM0<0:2> that a redundant word line is required to be refreshed. The redundant word line is immediately adjacent to another redundant word line. The other redundant word line will replace a damaged normal word line to be activated.

In the present embodiment, the redundant refresh circuit 312 determines that the first redundant word line RWL0 is required to be refreshed in response to that the second redundant word line RWL1 replaces the second normal word line WL1 to be activated. In that case, for example, the redundant refresh circuit 312 provides the determination including a series of number of [100] as a determination RM1 to the row decoder 314. The way to interpret the series of number of [100] is the same as that of the determination RM0<0:2>. Similarly, the redundant refresh circuit 312 also determines that the third redundant word line RWL2 is required to be refreshed in response to that the second redundant word line RWL1 replaces the second normal word line WL1 to be activated. In that case, the redundant refresh circuit 312 provides the determination including a series of number of [001] as the determination RM1 to the row decoder 314. In the present example, the first redundant word line RWL0 is determined first. However, an order for determining which redundant word line is to be refreshed is interchangeable. For example, in another example, the third redundant word line RWL2 can be determined first. For simplifying the description, in the following text, only the determination of the first redundant word line RWL0 will be discussed. The description related to another immediately adjacent third redundant word line RWL2 is similar to such.

Moreover, the redundant refresh circuit 312 retains the determination indicating that the first redundant word line RWL0 is required to be refreshed until the redundant refresh circuit 312 receives a signal including a row hammer command RH_REF. The row hammer command RH_REF indicates to refresh a redundant word line immediately adjacent to another redundant word line, wherein the other redundant word line replaces a damaged normal word line to be activated. Further, the redundant refresh circuit 312 provides the determination as a determination RM1 to the row decoder 314 in a condition that the redundant refresh circuit 312 receives the row hammer command RH_REF. Otherwise, the redundant refresh circuit 312 provides the determination RM0<0:2> as the determination RM1 to the row decoder 314.

The row decoder 314 is configured to receive the determination RM1 and one of the signal ADDR00 and the address ADDR0. When one of the numbers of the determination RM1 is not zero, the row decoder 314 ignores the one of the signal ADDR00 and the address ADDR0, and refreshes a redundant word line indicated by the determination RM1. For example, when the determination RM1 is <100>, the row decoder 314 ignores the one of the signal ADDR00 and the address ADDR0 from the target row counter 306, and refreshes the first redundant word line RWL0 indicated by the determination RM1 of <100>. Alternatively, when the determination RM1 is <001>, the row decoder 314 ignores the one of the signal ADDR00 and the address ADDR0 from the target row counter 306, and refreshes the third redundant word line RWL2 indicated by the determination RM1 of <001>. Contrarily, when all of the numbers in the determination RM1 are zero, the row decoder 314 ignores the determination RM1, and refreshes a normal word line indicated by the one of the signal ADDR00 and the address ADDR0.

It is assumed that the second word line WL1 is assigned to be activated; and the second word line WL1 is damaged and replaced by the second redundant word line RWL1. In an active operation, the primary MUX 308 receives the address [01] and the signal ADDR00 that includes one of the addresses [00] and [10]. Since now the active operation is performed, the primary MUX 308, in response to the selection signal Select_1 indicating the active operation is performed, outputs the address [01]. The redundancy match circuit 310 provides the determination RM0<0:2> of [010] to the redundant refresh circuit 312. The redundant refresh circuit 312 according to RM0<0:2> of [010] determines [001] and [100]. Since now the active operation, rather than the row hammer refresh operation, is performed, the redundant refresh circuit 312 provides the determination RM0<0:2> of [010] as the determination RM1 to the row decoder 314. The row decoder 314 receives the address [01] from the primary MUX 308, and the determination RM0<0:2> of [010] from the redundancy refresh circuit 312. The row decoder 314 ignores the address [01], and, according to the determination RM0<0:2> of [010], activates the second redundant word line RWL1.

After the active operation is performed, the row hammer refresh operation is performed. Since now the row hammer refresh operation is performed, the primary MUX 308, in response to the selection signal Select_1 indicating the row hammer refresh operation is performed, outputs the address [00]. The redundancy match circuit 310 according to the address [00] provides the determination RM0<0:2> of [000] to the redundancy refresh circuit 312. Since now the row hammer operation is performed, the redundancy refresh circuit 312 provides [100] obtained in the active operation, rather than the determination RM0<0:2> of [000], as the determination RM1 to the row decoder 314. The row decoder 314 ignores the address [00], and refreshes the first redundant word line RWL0 indicated by the determination RM1 of [100].

With the redundant refresh circuit 312, the first redundant word line RWL0 and the third redundant word line RWL2 immediately adjacent to the second redundant word line RWL1 can be refreshed, wherein the second redundant word line RWL1 replaces the damaged second normal word line WL1 to be activated. The row hammer issue is accordingly alleviated, or even eliminated. As a result, the first redundant word line RWL0 can be used to replace a word line to be activated. Also, the third redundant word line RWL2 can be used to replace another word line to be activated. Usage of a redundant word line is relatively efficient. As a result, an area cost is relatively low.

In contrast, in some existing circuits, such circuits are unable to determine a first redundant word line immediately adjacent to a second redundant word line. The second redundant word line is used to replace a damaged normal word line to be activated. In that case, the first redundant word line cannot be refreshed, and therefore suffers from the row hammer issue, which means that a data stored in a DRAM cell controlled by the first redundant word line may be flipped. In view of this, the first redundant word line is not useable. Usage of redundant word lines of the existing circuits is relatively inefficient. As a result, an area cost is relatively high.

Figure 4:
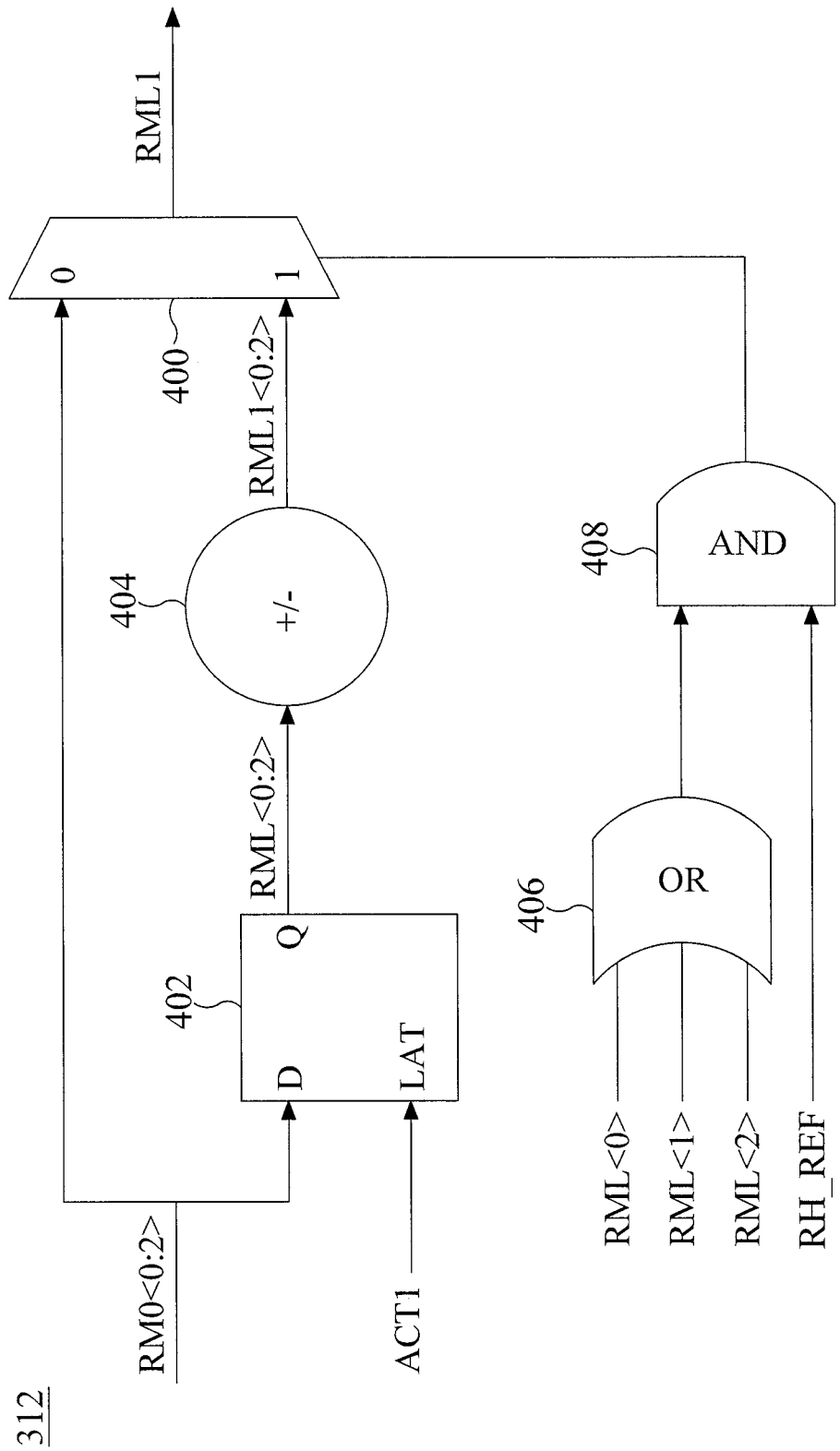
FIG. 4 is a circuit diagram of the redundant refresh circuit shown in FIG. 3 in accordance with some embodiments of the present disclosure.

FIG. 4 is a circuit diagram of the redundant refresh circuit 312 shown in FIG. 3 in accordance with some embodiments of the present disclosure. Referring to FIG. 4, the redundant refresh circuit 312 includes a refresh multiplexer 400, a latch 402, a shift circuit 404, an OR gate 406 and an AND gate 408.

The latch 402 is configured to, in response to the active command ACT1, receive the determination RM0<0:2>, and retain the determination RM0<0:2>. After receiving the current active command ACT1 and before receiving the next active command ACT1, no matter how the information in the determination RM0<0:2> is changed, the latch 402 keeps providing the same information in a signal RML<0:2> as the information in the determination RM0<0:2> at a time of receiving the current active command ACT1. For example, when the latch 402 receives the current active command ACT1, the information in the determination RM0<0:2> is [010]. The latch 402 keeps providing the same information [010] in the signal RML<0:2> until the next active command ACT1.

The shift circuit 404 is configured to determine that the first redundant word line RWL0 is required to be refreshed according to the information [010] in the signal RML<0:2> from the latch 402. The determination operation performed by the shift circuit 404 will be described and illustrated in detail with reference to FIG. 5. The shift circuit 404 provides the determination RML1<0:2> of [100] to a terminal "1" of the refresh multiplexer 400. The first number "1" in the value <100> of the determination RML1<0:2> represents that the first redundant word line RWL0 is required to be refreshed. Also, the shift circuit 404 is configured to determine the third redundant word line RWL2 is required to be refreshed according to the information [010] in the signal RML<0:2> from the latch 402. The shift circuit 404 provides the determination RML1<0:2> of [001] to the refresh multiplexer 400. The third number "1" in the value [001] of the determination RML1<0:2> represents that the third redundant word line RWL2 is required to be refreshed. On the other hand, when the determination RML<0:2> from the latch 402 is <000>, the shift circuit 404 determines that there is not any redundant word line required to be refreshed.

The OR gate 406 is configured to receive a first signal RML<0>, a second signal RML<1> and a third signal RML<2>. The logic level of the first signal RML<0> is the same as the first number of a value recorded in the signal RML<0:2>. For example, the value of the signal RML<0:2> is <010>, and then the logic level of the first signal RML<0> is 0. The logic level "0" of the first signal RML<0> indicated that the first redundant word line RWL0 is deactivated, or is not used to replace a damaged normal word line to be activated. Similarly, the logic level of the second signal RML<1> is the same as the second number of a value recorded in the signal RML<0:2>. According to the previous example, the logic level of the second signal RML<1> is 1, and so on. The logic level "1" of the second signal RML<1> indicates that the second redundant word line RWL1 is activated, or is used to replace a damaged normal word line to be activated.

The AND gate 408 is configured to receive a signal from the OR gate 406, and the signal (i.e., the row hammer refresh command RH_REF) including the information on whether to refresh a redundant word line immediately adjacent to another redundant word line, wherein the other redundant word line replaces the damaged normal word line to be activated. For example, the logic level "1" of the signal represents refreshing the redundant word line immediately adjacent to the other redundant word line; and the logic level "0" of the signal represents not refreshing the redundant word line immediately adjacent to the other redundant word line.

In this embodiment, with the logic level "0" of the first signal RML<0>, the logic level "1" of the second signal RML<1>, the logic level "0" of the third signal RML<2> and the logic level "1" of the signal, the AND gate 408 provides a logic level "1" to the refresh multiplexer 400. That is, the AND gate 408 outputs the signal including the information on refreshing the redundant word line immediately adjacent to the other redundant word line.

The refresh multiplexer 400 is configured to receive the determination RM0<0:2>, and provide one of the received determination RM0<0:2> and the determination RML1<0:2> as the determination RM1 to a row decoder 314. Specifically, the refresh multiplexer 400 is configured to provide one of the received determination RM0<0:2> and the determination RML1<0:2> as the determination RM1 to the row decoder 314 based on a signal including a command indicating whether to refresh a redundant word line immediately adjacent to another redundant word line. The other redundant word line replaces a damaged normal word line to be activated (i.e., based on a row hammer refresh command).

For example, the refresh multiplexer 400 provides the determination RML1<0:2> from the shift circuit 404 as the determination RM1 to the row decoder 314 if the signal including the command indicating to refresh the redundant word line immediately adjacent to the other redundant word line. In other words, the refresh multiplexer 400 retains the determination RML1<0:2> until receiving a signal including the command indicating to refresh the redundant word line immediately adjacent to the other word line to be activated, and provide the determination RML1<0:2> as the determination RM1 to the row decoder 314 after the refresh multiplexer 400 receives such signal. Alternatively, the refresh multiplexer 400 provides the received determination RM0<0:2> as the determination RM1 to the row decoder 314 if the signal including the command to not refresh the redundant word line immediately adjacent to the other redundant word line.

Figure 5:
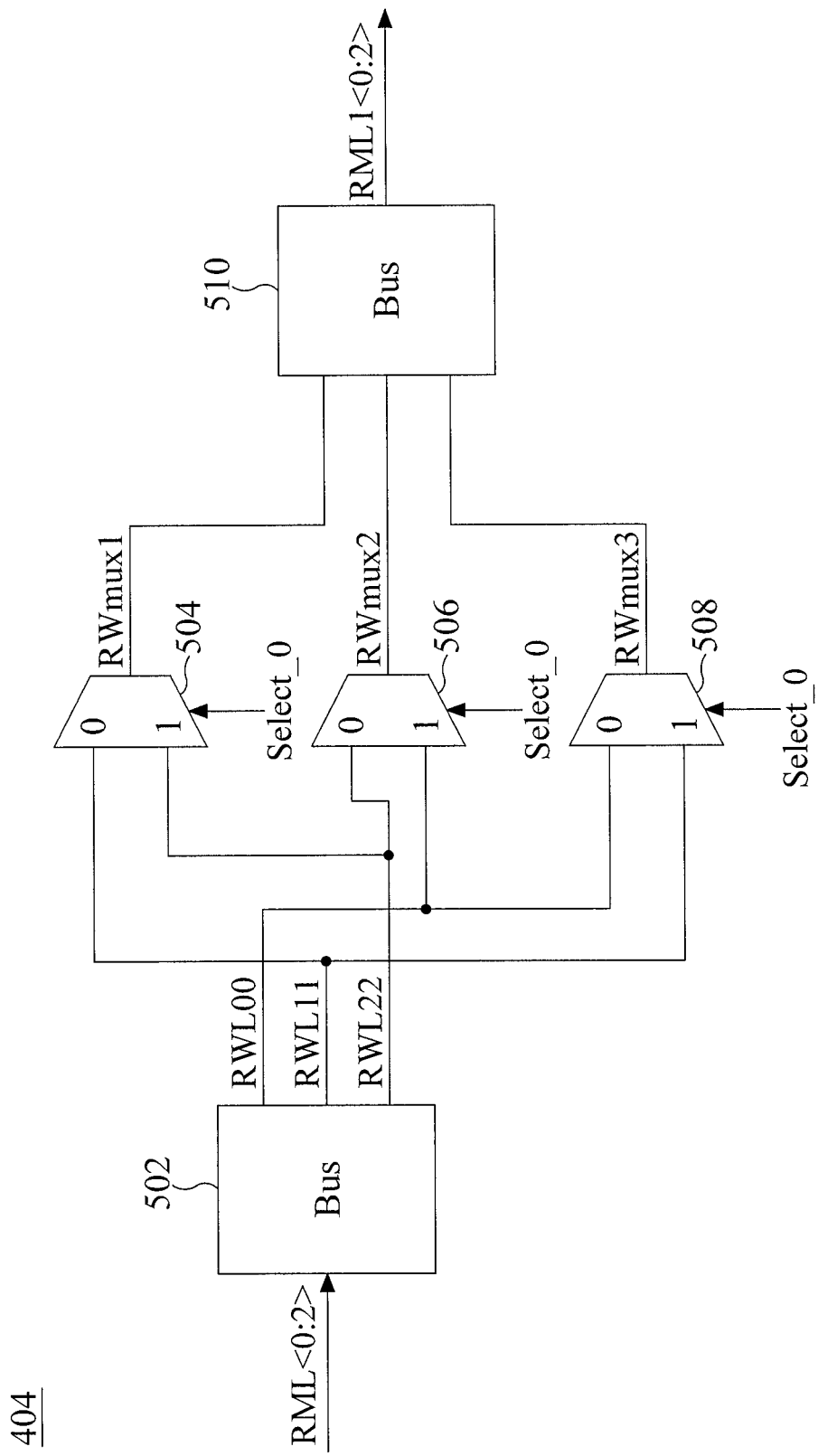
FIG. 5 is a circuit diagram of the shift circuit shown in FIG. 4 in accordance with some embodiments of the present disclosure.

FIG. 5 is a circuit diagram of the shift circuit 404 shown in FIG. 4 in accordance with some embodiments of the present disclosure. Referring to FIG. 5, the shift circuit 404 includes a bus 502, a multiplexer 504, a multiplexer 506, a multiplexer 508 and a bus 510. The bus 502 is configured to assign a first value of the information of the signal RML<0:2> as a logic level to a first line RWL00, a second value of the information of the signal RML<0:2> as a logic level to a second line RWL11, and a third value of the information of the signal RML<0:2> as a logic level to a third line RWL22.

The line RWL00 is connected to a terminal "1" of the multiplexer 506 and a terminal "0" of the multiplexer 508. The line RWL11 is connected to a terminal "0" of the multiplexer 504 and a terminal "1" of the multiplexer 508. The RWL22 is connected to a terminal "1" of the multiplexer 504 and a terminal "0" of the multiplexer 506. Furthermore, an output of the multiplexer 504 is connected to a line RWmux1; an output of the multiplexer 506 is connected to a line RWmux2; and an output of the multiplexer 508 is connected to a line RWmux3.

In response to a first logic level of a signal select_0, the multiplexer 504 connects the line RWL00 connected to its terminal "0" to the line RWmux1; the multiplexer 506 connects the line RWL22 connected to the its terminal "0" to the line RWmux2; and the multiplexer 508 connects the line RWL22 connected to its terminal "0" to the line RWmux3, and so on.

In the present embodiment, the signal RML<0:2> includes information <010>. The logic level of the line RWL00 is "0", the logic level of the line RWL11 is "1" and the logic level of the line RWL22 is "0". In response to the first logic level of the signal select_0, the logic level of the line RWmux1 is "1", the logic level of the line Rwmux2 is "0" and the logic level of the line RWmux3 is "0". The bus 510 merges the logic levels in the lines RWmux1 to RWmux3, and provides a determination RML1<0:2>=<100>, which indicates that the first redundant word line RWL0 is required to be refreshed. For the similar operation, in response to a second logic level of the signal select_0, the bus 510 provides the determination RML1<0:2>=<001>, which indicates that the third redundant word line RWL2 is required to be refreshed.

Figure 6:
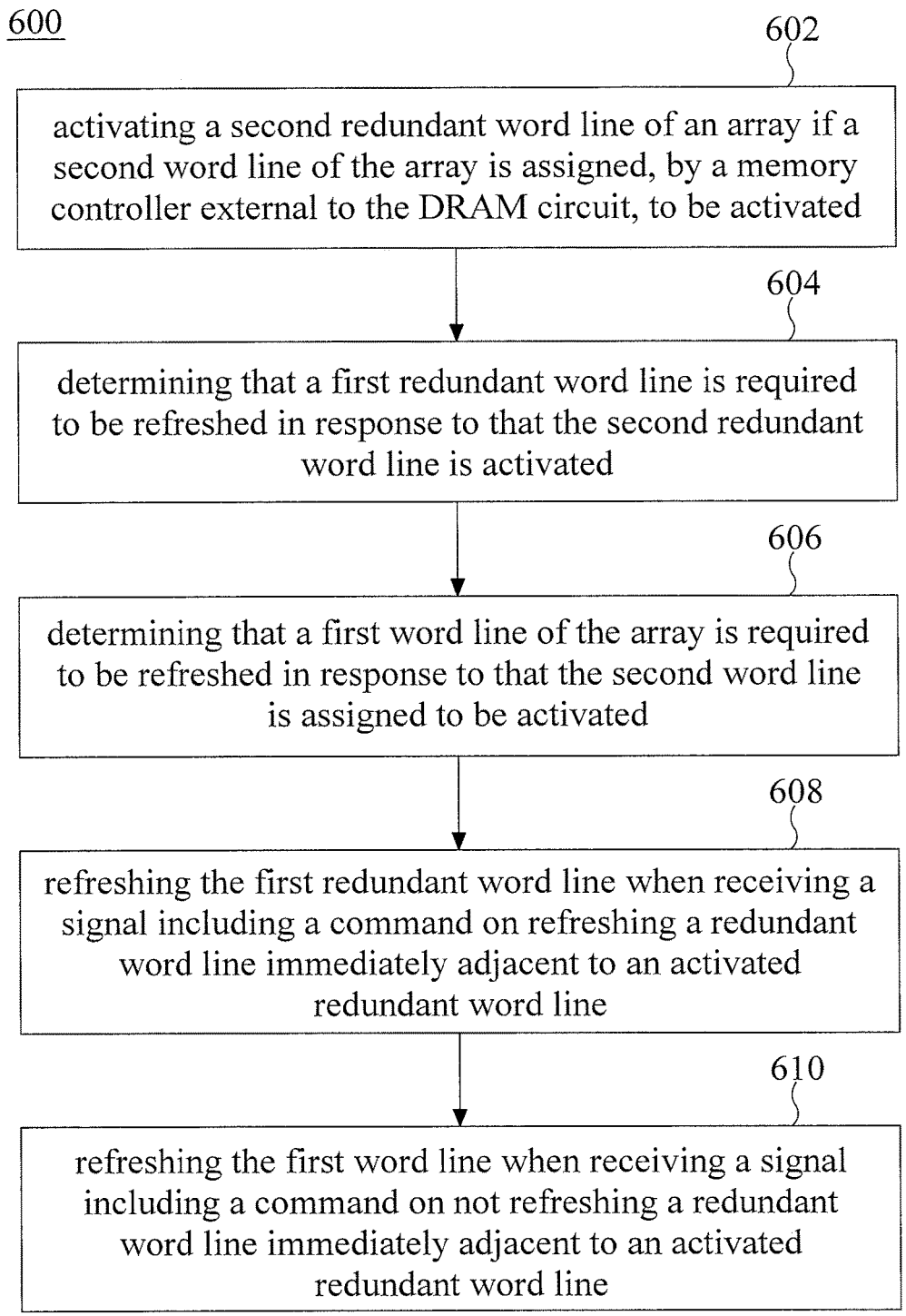
FIG. 6 is a flow chart illustrating a refresh method in accordance with some embodiments of the present disclosure.

FIG. 6 is a flow chart illustrating a refresh method 600 in accordance with some embodiments of the present disclosure. Referring to FIG. 6, in operation 602, a second redundant word line of an array is activated if a second normal word line of the array is assigned, by a memory controller external to the DRAM circuit, to be activated.

In operation 604, it is determined that a first redundant word line of the array is required to be refreshed in response to the second redundant word line being activated, wherein the first redundant word line is immediately adjacent to the second redundant word line.

In operation 606, it is determined that a first normal word line of the array is required to be refreshed in response to the second normal word line being assigned to be activated, wherein the first normal word line is immediately adjacent to the second normal word line.

In operation 608, the first redundant word line is refreshed when receiving a signal including a command (i.e., a row hammer refresh command) indicating to refresh a redundant word line immediately adjacent to an activated redundant word line.

In operation 610, the first normal word line is refreshed when receiving a signal including a command to not refresh a redundant word line immediately adjacent to an activated redundant word line.

In some embodiments, the present disclosure provides a DRAM circuit. The DRAM circuit includes an array, a redundant refresh circuit and a row decoder. The array includes a normal word line, a first redundant word line and a second redundant word line immediately adjacent to the first redundant word line. The second redundant word line is activated if the normal word line is assigned, by a memory controller external to the DRAM circuit, to be activated. The redundant refresh circuit is configured to determine that the first redundant word line is required to be refreshed in response to the second redundant word line being activated. The row decoder configured to, according to the determination of the redundant refresh circuit, refresh the first redundant word line.

In some embodiments, the present disclosure provides a redundant refresh circuit in a DRAM circuit. The redundant refresh circuit includes a latch and a shift circuit. The latch is configured to receive a determination indicating that a second redundant word line of an array is to be activated, and retain the determination. The second redundant word line is activated if a word line of the array is assigned to be activated, by a command external to the redundant refresh circuit. The shift circuit is configured to determine that a first redundant word line of the array is required to be refreshed according to the determination from the latch. The first redundant word line is immediately adjacent to the second redundant word line.

In some embodiments, the present disclosure provides a refresh method. The refresh method includes activating a second redundant word line of an array if a second normal word line of the array is assigned, by a memory controller external to the DRAM circuit, to be activated; determining that a first redundant word line of the array is required to be refreshed in response to the second redundant word is line being activated, wherein the first redundant word line is immediately adjacent to the second redundant word line; determining that a first normal word line of the array is required to be refreshed in response to the second normal word line being assigned to be activated, wherein the first normal word line is immediately adjacent to the second normal word line; and either refreshing the first redundant word line according to the determination that the first redundant word line is required to be refreshed, or refreshing the first normal word line according to the determination that the first normal word line is required to be refreshed With a redundant refresh circuit of the present disclosure, a first redundant word line and a third redundant word line immediately adjacent to an activated second redundant word line can be refreshed. A row hammer issue is accordingly alleviated, or even eliminated. As a result, the first redundant word line can be used to replace a word line to be activated. Also, the third redundant word line can be used to replace another word line to be activated. Usage of a redundant word line is relatively efficient. As a result, an area cost is relatively low.

In contrast, in some existing circuits, such circuits are unable to determine a first redundant word line immediately adjacent to a second redundant word line to be activated. In that case, the first redundant word line cannot be refreshed, and therefore suffers from the row hammer issue, which means that a data stored in a DRAM cell controlled by the first redundant word line may be flipped. In view of this, the first redundant word line is not useable. Usage of redundant word lines of the existing circuits is relatively inefficient. As a result, an area cost is relatively high.

In the previous content of the present disclosure, when a row hammer refresh command is received, it is required to refresh a normal word line, wherein the normal word line is immediately adjacent to another normal word line. The other normal word line is not damaged, and is not replaced by a redundant word line to be activated. Alternatively, when a row hammer refresh command is received, it is required to refresh a redundant word line, wherein the redundant word line is immediately adjacent to another redundant word line. The other redundant word line replaces a damaged normal word line to be activated.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A DRAM circuit, comprising:
    an array including a normal word line, a first redundant word line and a second redundant word line immediately adjacent to the first redundant word line, wherein the second redundant word line is activated if the normal word line is assigned, by a memory controller external to the DRAM circuit, to be activated, wherein the normal word line is a second normal word line, the array further includes a first normal word line immediately adjacent to the second normal word line;
    a redundant refresh circuit configured to determine that the first redundant word line is required to be refreshed in response to the second redundant word line being activated;
    a row decoder configured to, according to the determination of the redundant refresh circuit, refresh the first redundant word line; and
    a target row counter configured to deter mine that the first normal word line is required to be refreshed in response to the second normal word line being assigned to be activated, wherein the row decoder ignores the determination from the target row counter, and, according to the determination from the redundant refresh circuit, refresh the first redundant word line.

2. The DRAM circuit of claim 1, further comprising:
    a redundancy match circuit configured to determine that the second redundant word line is to be activated in a condition that the redundancy match circuit receives a signal including information on an address of the second normal word line.

3. The DRAM circuit of claim 2, further comprising:
    a primary multiplexer configured to receive the signal including the information on the address of the second normal word line and a signal including the determination from the target row counter, and pass to the redundancy match circuit one of the signal including the information and the signal including the determination.

4. The DRAM circuit of claim 2, wherein the redundant refresh circuit includes:
    a latch configured to retain the determination indicating that the second redundant word line is to be activated; and
    a shift circuit configured to determine that the first redundant word line of the array is required to be refreshed according to the determination from the latch.

5. The DRAM circuit of claim 4, wherein the redundant refresh circuit includes:
    a refresh multiplexer configured to retain the determination from the shift circuit until receiving a signal including a command indicating to refresh a redundant word line immediately adjacent to a redundant word line to be activated.

6. The DRAM circuit of claim 5, wherein the refresh multiplexer is configured to provide the determination from the shift circuit to the row decoder after the refresh multiplexer receives the signal including the command indicating to refresh the redundant word line immediately adjacent to the redundant word line to be activated.

7. The DRAM circuit of claim 6, further comprising:
an OR gate configured to receive a first signal with a first logic level and a second signal with a second logic level, and output a third signal with the first logic level, wherein the first logic level of the first signal indicates that the first redundant word line is to be deactivated, the second logic level of the second signal indicates that the second redundant word line is to be activated, and the first logic level of the third signal indicates that one of the first redundant word line and the second redundant word line is to be activated.

8. The DRAM circuit of claim 7, further comprising:
an AND gate configured to receive the third signal and the signal including the command indicating to refresh the redundant word line immediately adjacent to the redundant word line to be activated, and output the signal including the command indicating to refresh the redundant word line immediately adjacent to the redundant word line to be activated.

9. A redundant refresh circuit in a DRAM circuit, comprising:
a latch configured to receive a determination indicating that a second redundant word line of an array is to be activated, and retain the determination, wherein the second redundant word line is activated if a word line of the array is assigned to be activated, by a command external to the redundant refresh circuit; and
a shift circuit configured to determine that a first redundant word line of the array is required to be refreshed according to the determination from the latch, wherein the first redundant word line is immediately adjacent to the second redundant word line.

10. The redundant refresh circuit of claim 9, comprising:
a refresh multiplexer configured to receive the determination from the shift circuit until receiving a signal including a command indicating to refresh a redundant word line immediately adjacent to a redundant word line to be activated, and provide the determination from the shift circuit to a row decoder external to the redundant refresh circuit after the refresh multiplexer receives the signal.

11. The redundant refresh circuit of claim 9, comprising:
a refresh multiplexer configured to receive the determination, and provide to a row decoder one of the received determination and the determination from the shift circuit.

12. The redundant refresh circuit of claim 11, wherein the refresh multiplexer is further configured to provide to the row decoder one of the received determination and the determination from the shift circuit based on a signal including a command on whether to refresh a redundant word line immediately adjacent to a redundant word line to be activated.

13. The redundant refresh circuit of claim 12, wherein the refresh multiplexer provides the determination from the shift circuit to the row decoder if the signal including the command indicating to refresh the redundant word line immediately adjacent to the redundant word line to be activated.

14. The redundant refresh circuit of claim 13, further comprising:
an OR gate configured to receive a first signal with a first logic level and a second signal with a second logic level, and output a third signal with the first logic level, wherein the first logic level of the first signal indicates that the first redundant word line is to be deactivated, the second logic level of the second signal indicates that the second redundant word line is to be activated, and the first logic level of the third signal indicates that one of the first redundant word line and the second redundant word line is to be activated.

15. The redundant refresh circuit of claim 14, further comprising:
an AND gate configured to receive the third signal and the signal including the command on whether to refresh the redundant word line immediately adjacent to the redundant word line to be activated.

16. A refresh method of a redundant refresh circuit in a DRAM circuit, comprising:
activating a second redundant word line of an array if a second normal word line of the array is assigned, by a command external to the redundant refresh circuit, to be activated;
receiving and retaining a determination indicating that the second redundant word line of the array is to be activated;
determining that a first redundant word line of the array is required to be refreshed according to the determination indicating that the second redundant word line is to be activated, wherein the first redundant word line is immediately adjacent to the second redundant word line;
determining that a first normal word line of the array is required to be refreshed in response to the second normal word line being assigned to be activated, wherein the first normal word line is immediately adjacent to the second normal word line; and
either refreshing the first redundant word line according to the determination that the first redundant word line is required to be refreshed, or refreshing the first normal word line according to the determination that the first normal word line is required to be refreshed.

17. The refresh method of claim 16, wherein refreshing the first redundant word line is performed when receiving a signal including a command indicating to refresh a redundant word line immediately adjacent to an activated redundant word line.

18. The refresh method of claim 16, wherein refreshing the first normal word line is performed when receiving a signal including a command indicating not to refresh a redundant word line immediately adjacent to an activated redundant word line.

19. A DRAM circuit, comprising:
an array including a normal word line, a first redundant word line and a second redundant word line immediately adjacent to the first redundant word line, wherein the second redundant word line is activated if the normal word line is assigned, by a memory controller external to the DRAM circuit, to be activated;
a redundant refresh circuit configured to determine that the first redundant word line is required to be refreshed in response to the second redundant word line being activated; and
a row decoder configured to, according to the determination of the redundant refresh circuit, refresh the first redundant word line,
wherein the redundant refresh circuit retains the determination until the redundant refresh circuit receives a signal including a command indicating to refresh a redundant word line immediately adjacent to a redundant word line to be activated, and the redundant refresh circuit provides the determination to the row decoder after the redundant refresh circuit receives the signal.

\* \* \* \* \*